(12) United States Patent
Lin et al.

(10) Patent No.: US 11,870,007 B2
(45) Date of Patent: Jan. 9, 2024

(54) LIGHT-EMITTING ELEMENT, DISPLAY DEVICE AND BACKLIGHT UNIT

(71) Applicant: EPISTAR CORPORATION, Hsinchu (TW)

(72) Inventors: Che-Hung Lin, Hsinchu (TW); De Shan Kuo, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 160 days.

(21) Appl. No.: 17/136,776

(22) Filed: Dec. 29, 2020

(65) Prior Publication Data
US 2021/0202794 A1    Jul. 1, 2021

(30) Foreign Application Priority Data
Dec. 31, 2019 (TW) ................................. 108148641

(51) Int. Cl.
| *H01L 33/08* | (2010.01) |
| *H01L 33/00* | (2010.01) |
| *H01L 33/38* | (2010.01) |
| *H01L 33/62* | (2010.01) |
| *H01L 33/22* | (2010.01) |

(52) U.S. Cl.
CPC .......... *H01L 33/08* (2013.01); *H01L 33/0093* (2020.05); *H01L 33/0095* (2013.01); *H01L 33/22* (2013.01); *H01L 33/382* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| 2011/0281383 A1* | 11/2011 | Chung | ................ H01L 33/005 438/33 |
| 2012/0326191 A1 | 12/2012 | Fu | |
| 2017/0108173 A1* | 4/2017 | Kim | ....................... H01L 33/32 |

FOREIGN PATENT DOCUMENTS

TW            201301566 A       1/2013

* cited by examiner

*Primary Examiner* — Robert K Carpenter
(74) *Attorney, Agent, or Firm* — MUNCY, GEISSLER, OLDS & LOWE, P.C.

(57) ABSTRACT

A method of manufacturing a light-emitting element, includes: providing a base having an upper surface and a lower surface; forming a semiconductor stack on the upper surface; removing part of the semiconductor stack to form an isolation region surrounding the semiconductor stack; forming a dielectric stack covering the semiconductor stack and the isolation region; and applying a first laser having a first wavelength to irradiate the base along the isolation region; wherein the dielectric stack has a reflectance of 10%-50% and/or a transmittance of 50%-90% for the first wavelength.

19 Claims, 11 Drawing Sheets

B-B'

US 11,870,007 B2

LIGHT-EMITTING ELEMENT, DISPLAY DEVICE AND BACKLIGHT UNIT

CROSS-REFERENCE TO RELATED APPLICATIONS

This application claims priority to the benefit of Taiwan Patent Application Number 108148641 filed on Dec. 31, 2019, and the entire contents of which are hereby incorporated by reference herein in its entirety.

BACKGROUND

Technical Field

The present application relates to a light-emitting element and a manufacturing method thereof, more specifically, to a light-emitting element and a manufacturing method thereof with improved yield.

Description of the Related Art

The light-emitting diode devices of solid-state lighting device have the characteristics of low power consumption, low heat-generation, long lifetime, compact size, high response speed and stable emission wavelength. Thus, the light-emitting diode devices have been widely used in household appliance, lighting device, indicating lamp, optical device and the like.

A conventional light-emitting diode device includes a substrate, an n-type semiconductor layer, an active region, a p-type semiconductor layer formed on the substrate, and p-electrode and n-electrode respectively formed on the p-type and n-type semiconductor layers. By applying a certain forward voltage to the light-emitting diode devices via the electrodes, holes from the p-type semiconductor layer and electrons from the n-type semiconductor layer are combined in the active region so as to emit light. While the size of the light-emitting diode device becomes smaller, how to keep good optoelectronic characteristics thereof and improve the dicing yield concerns people in the present technology field.

SUMMARY

A method of manufacturing a light-emitting element, includes: providing a base having an upper surface and a lower surface; forming a semiconductor stack on the upper surface; removing part of the semiconductor stack to form an isolation region surrounding the semiconductor stack; forming a dielectric stack covering the semiconductor stack and the isolation region; and applying a first laser having a first wavelength to irradiate the base along the isolation region; wherein the dielectric stack has a reflectance of 10%-50% and/or a transmittance of 50%-90% for the first wavelength.

A light-emitting element, includes: a base having an upper surface, a lower surface and a plurality of side walls; a plurality of first modified regions formed on any one of the plurality of side walls, and wherein one of the plurality of first modified regions connects the lower surface and the upper surface in a direction perpendicular with the lower surface; a semiconductor stack formed on the upper surface; an isolation region on the upper surface, not covered by the semiconductor stack and surrounding the semiconductor stack; and a dielectric stack covering the semiconductor stack and the isolation region.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1:
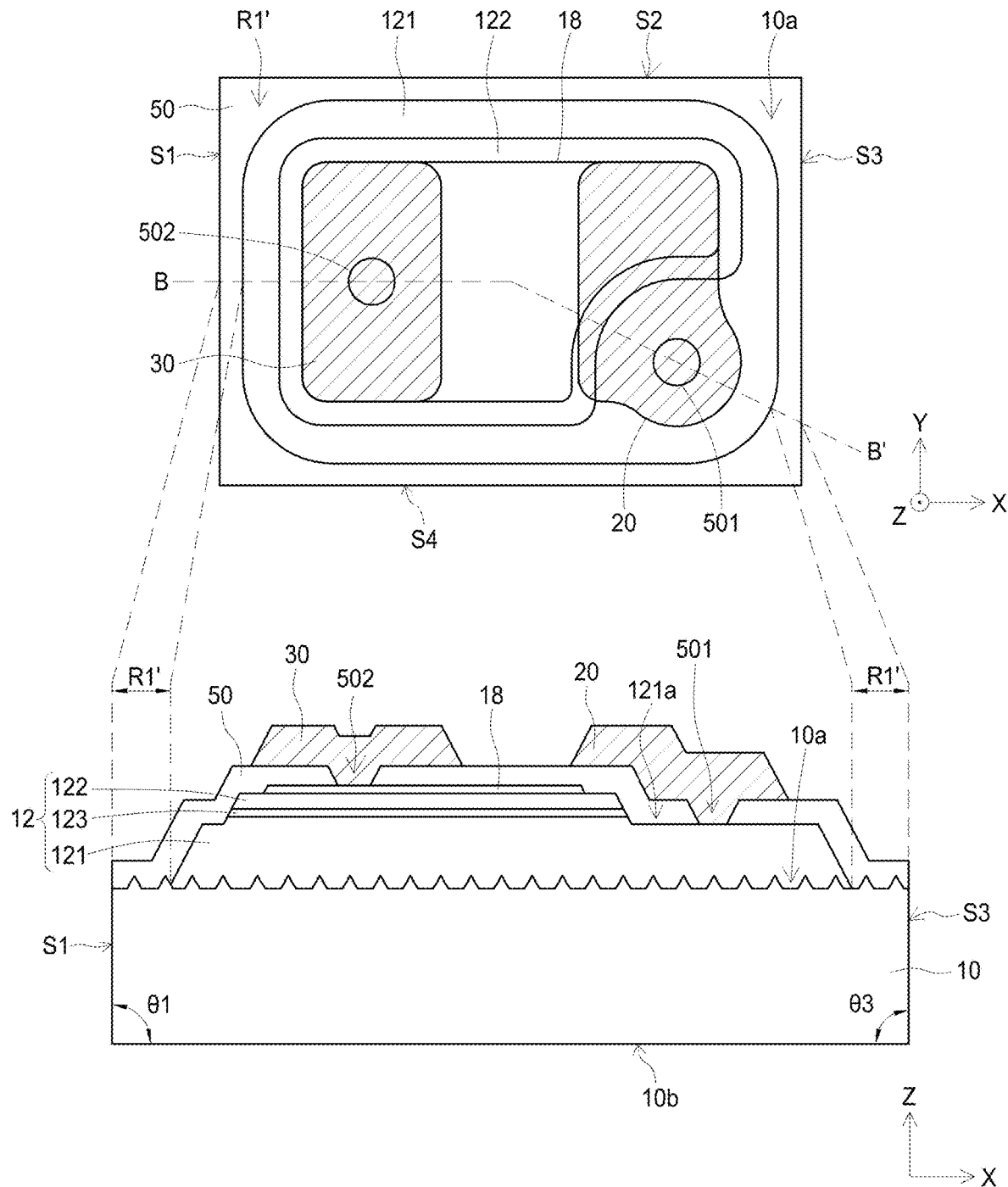
FIG. 1 shows a top view and a cross-sectional view of a light-emitting element 1 in accordance with an embodiment of the present disclosure.
Figure 2:
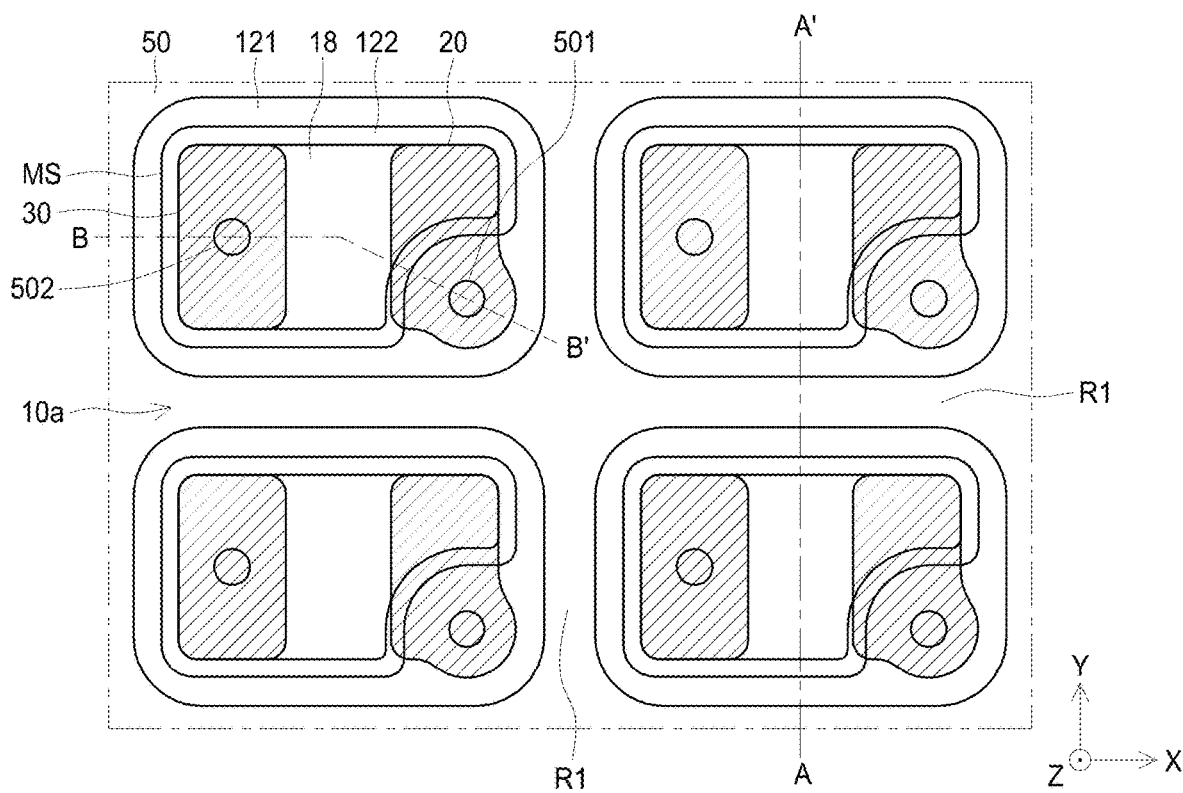
FIG. 2 shows a partial top view of a manufacturing method for the light-emitting element 1 in accordance with an embodiment of the present disclosure.
Figure 3:
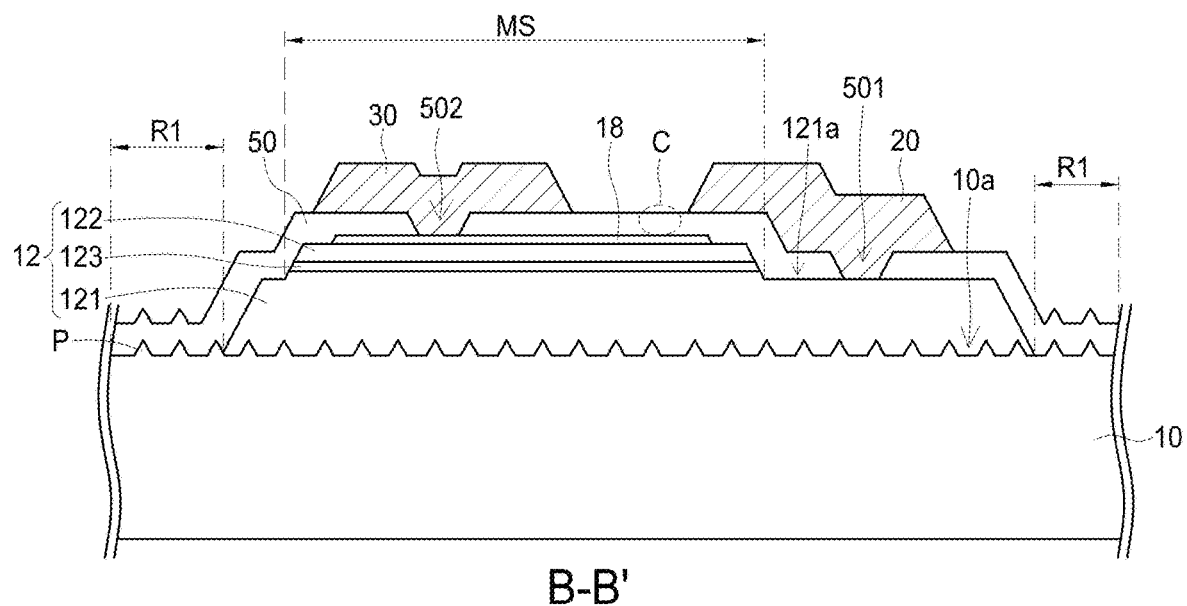
FIG. 3 shows a cross-sectional view taken along the B-B' line in FIG. 2.
Figure 4A:
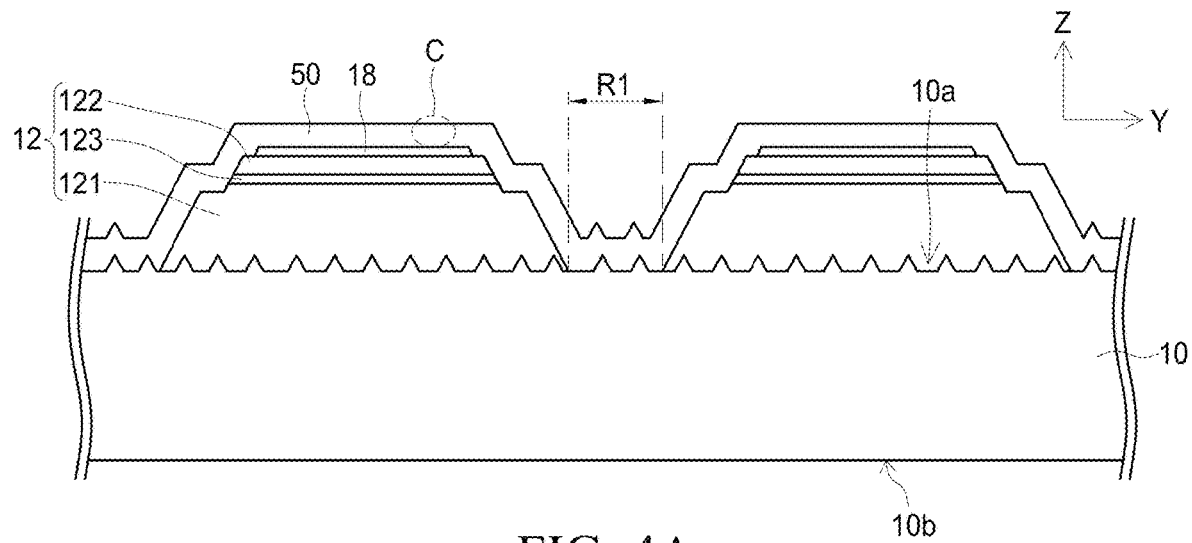
FIG. 4A shows a cross-sectional view taken along the A-A' line in FIG. 2.

FIG. 1 shows a top view and a cross-sectional view of a light-emitting element 1 in accordance with an embodiment of the present disclosure. FIG. 2 shows a partial top view of a manufacturing method for the light-emitting element 1 in accordance with an embodiment of the present disclosure. FIG. 3 shows a cross-sectional view taken along the B-B' line in FIG. 2. FIG. 4A shows a cross-sectional view taken along the A-A' line in FIG. 2.

As shown in FIG. 1, the light-emitting element 1 includes a base 10, a semiconductor stack 12 formed on an upper surface 10a of the base 10, a transparent conductive layer 18, a dielectric stack 50, a first electrode 20 and a second electrode 30. The semiconductor stack 12 includes a first semiconductor layer 121, an active region 123, and a second semiconductor layer 122 sequentially formed on the upper surface 10a. The transparent conductive layer 18 is formed on the second semiconductor layer 122. The dielectric stack 50 covers the semiconductor stack 12 and the transparent conductive layer 18, and includes openings 501 and 502 exposing the first semiconductor layer 121 and the transparent conductive layer 18, respectively. The first electrode 20 is formed on the dielectric stack 50 and is electrically connected to the first semiconductor layer 121 through the opening 501. The second electrode 30 is formed on the dielectric stack 50 and is electrically connected to the second semiconductor layer 122 through the opening 502.

In one embodiment, the manufacturing method for the light-emitting element 1 is described in detail as follows. Referring to FIGS. 2 and 3, first, the semiconductor stack 12 and the mesa (MS) are formed. In the present embodiment, the base in the manufacturing method and the base of the light-emitting element are represented by the same symbols. The base 10 and the semiconductor stack 12 formed thereon constitute a semiconductor wafer WF1. FIG. 2 shows a partial top view of the semiconductor wafer WF1.

The base 10 can be a growth substrate for growing semiconductor layers thereon. The base 10 includes GaAs or GaP for growing AlGaInP semiconductor thereon. The base 10 includes sapphire, GaN, SiC or AlN for growing InGaN or AlGaN thereon. The base 10 includes the upper surface 10a. The base 10 can be a patterned substrate; that is, the base 10 includes a plurality of patterned structures P on the upper surface 10a. In one embodiment, the light generated from the semiconductor stack 12 is refracted by the patterned structures P, thereby increasing the brightness of the light-emitting element. In addition, the patterned structures P lessen or suppress the dislocation by lattice mismatch between the base 10 and the semiconductor stack 12, thereby improving the epitaxy quality of the semiconductor stack 12.

In an embodiment of the present application, the semiconductor stack 12 is formed on the base 10 by metal-organic chemical vapor deposition (MOCVD), molecular beam epitaxy (MBE), hydride vapor epitaxy (HVPE) or ion plating such as sputtering or evaporating.

A buffer structure (not shown), the first semiconductor layer 121, the active region 123, and the second semiconductor layer 122 are sequentially formed on the base 10. The buffer structure, the first semiconductor layer 121, the active region 123 and the second semiconductor layer 122 constitute the semiconductor stack 12. The buffer structure reduces the lattice mismatch and suppresses dislocation so as to improve the epitaxy quality. The material of the buffer structure includes GaN, AlGaN, or AlN. In an embodiment, the buffer structure includes a plurality of sub-layers (not shown) and the sub-layers include the same materials or different materials. In one embodiment, the buffer structure includes two sub-layers and wherein a first sub-layer thereof is grown by sputtering and a second sub-layer thereof is grown by MOCVD. In another embodiment, the buffer structure further includes a third sub-layer. The third sub-layer is grown by MOCVD, and the growth temperature of the second sub-layer is higher or lower than the growth temperature of the third sub-layer. In an embodiment, the first, second, and third sub-layers include the same material, such as AlN. In another embodiment, the first semiconductor layer 121 and the second semiconductor layer 122 are, for example, cladding layers or confinement layers. The first semiconductor layer 121 and the second semiconductor layer 122 have different conductivity types, different electrical properties, different polarities or different dopants for providing electrons or holes. For example, the first semiconductor layer 121 is composed of n-type semiconductor and the second semiconductor layer 122 is composed of p-type semiconductor. The active region 123 is formed between the first semiconductor layer 121 and the second semiconductor layer 122. When being driven by a current, electrons and holes are combined in the active region 123 to convert electrical energy into optical energy for illumination. The wavelength of the light generated by the light-emitting element 1 or the semiconductor stack 12 can be adjusted by changing the physical properties and chemical composition of one or more layers in the semiconductor stack 12.

The material of the semiconductor stack 12 includes III-V semiconductor with $Al_xIn_yGa_{(1-x-y)}N$ or $Al_xIn_yGa_{(1-x-y)}P$, where $0 \leq x, y \leq 1$; $x+y \leq 1$. When the material of the semiconductor stack 12 includes AlInGaP, it emits red light having a wavelength between 610 nm and 650 nm or yellow light having a wavelength between 550 nm and 570 nm. When the material of the semiconductor stack 12 includes InGaN, it emits blue light or deep blue light having a wavelength between 400 nm and 490 nm or green light having a wavelength between 490 nm and 550 nm. When the material of the semiconductor stack 12 includes AlGaN, it emits UV light having a wavelength between 250 nm and 400 nm. The active region 123 can be a single hetero-structure (SH), a double hetero-structure (DH), a double-side double hetero-structure (DDH), or a multi-quantum well (MQW) structure. The material of the active region 123 can be i-type, p-type or n-type semiconductor.

Next, the mesas (MSs) are formed by removing portions of the semiconductor stack 12 to expose an upper surface 121a of the first semiconductor layer 121. The upper surface of the mesas (MSs) is the upper surface of the second semiconductor layer 122. In the top view, the upper surface 121a surrounds the mesa. The method of removing the portions of the semiconductor stack 12 includes etching.

Next, isolation regions R1 are formed. Referring to FIGS. 2 and 3, in this step, the first semiconductor layer 121 is removed from the upper surface 121a to expose the upper surface 10a of the base 10, and then the isolation region R1 is formed. The isolation region R1 separates the semiconductor stack 12 and defines a plurality of light-emitting element 1. The isolation region R1 is allocated for the pre-defined dicing line (not shown) for the subsequent dicing process.

Next, the transparent conductive layer 18 is formed. The transparent conductive layer 18 covers the upper surface of the second semiconductor layer 122 and electrically contacts the second semiconductor layer 122. The transparent conductive layer 18 can be metal or transparent conductive material. The metal material forms a thin metal layer having light transparency. The transparent conductive material is transparent to the light emitted from the active region 123, such as graphene, zinc aluminum oxide (AZO), gallium zinc oxide (GZO), zinc oxide (ZnO) or indium zinc oxide (IZO).

Next, the dielectric stack 50 is formed. The dielectric stack 50 is formed on the upper surface and side walls of each semiconductor stack 12 and the isolation region R1, and then processes such as photolithography and etching are performed to form separated openings 501 and 502. The opening 501 exposes the upper surface 121a of the first semiconductor 121 and the opening 502 exposes the transparent conductive layer 18. In another embodiment, the light-emitting element 1 is devoid of the transparent conductive layer 18; in this case, the opening 502 exposes the second semiconductor layer 123.

Figure 5A:
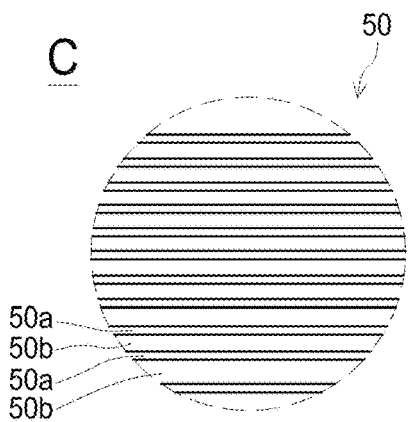
FIG. 5A and FIG. 5B show partial enlarged views of FIG. 2.

FIG. 5A shows a partial enlarged view of the area C of the dielectric stack 50 in FIG. 2. The dielectric stack 50 is formed by alternately stacking one or more pairs of dielectric materials with different refractive indexes. In the embodiment shown in FIG. 5A, the dielectric stack 50 includes a group of dielectric layers which is composed of a first sub-layer 50a and a second sub-layer 50b. A first sub-layer 50a and a second sub-layer 50b constitute a pair of dielectric pair. The first sub-layer 50a has a refractive index higher than that of the second sub-layer 50b. In one embodiment, the first sub-layer 50a has a smaller thickness than the second sub-layer 50b. The dielectric material includes silicon oxide, silicon nitride, silicon oxynitride, niobium oxide, hafnium oxide, titanium oxide, magnesium fluoride, or aluminum oxide. By selecting dielectric materials with different refractive index and the thickness thereof, the dielectric stack 50 forms a reflective structure, such as a distributed Bragg reflector (DBR).

In another embodiment, the dielectric stack 50 further includes other dielectric layers other than the first sub-layer 50a and the second sub-layer 50b. For example, the dielectric stack 50 further includes an under dielectric layer (not shown) between the first sub-layer 50a (and/or the second sub-layer 50b) and the semiconductor stack 12. In other words, the under dielectric layer is formed on the semiconductor stack 12 first, and then the first sub-layers 50a and the second sub-layers 50b are formed. The thickness of the under dielectric layer is greater than those of the first sub-layer 50a and the second sub-layer 50b. In one embodiment, the under dielectric layer can be formed by a process different from that for forming the first sub-layer 50a and the second sub-layer 50b. For example, the under dielectric layer is formed by chemical vapor deposition (CVD), and the first sub-layers 50a and the second sub-layers 50b are formed by sputtering.

Figure 5B:
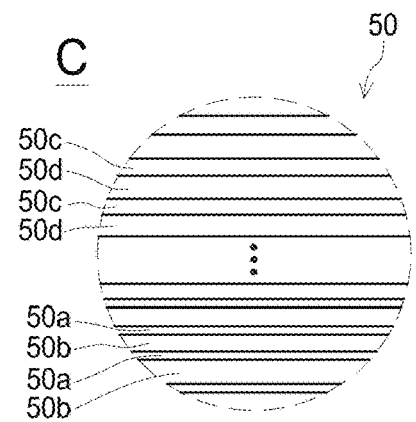

In another embodiment shown in FIG. 5B, the dielectric stack 50 includes a plurality of groups of dielectric layers. The first group of the dielectric layers is composed of the first sub-layer 50a and the second sub-layer 50b. The second group of the dielectric layers is composed of a third sub-layer 50c and a fourth sub-layer 50d alternately stacked. The third sub-layer 50c and the fourth sub-layer 50d constitute a pair of dielectric pair. The third sub-layer 50c has a higher refractive index than that of the fourth sub-layer 50d. In one embodiment, the third sub-layer 50c has a smaller thickness than that of the fourth sub-layer 50d. The third sub-layer 50c and the first sub-layer 50a have different thicknesses, and the third sub-layer 50c and the first sub-layer 50a are the same material or different materials. The fourth sub-layer 50d and the second sub-layer 50b have different thicknesses, and the fourth sub-layer 50d and the second sub-layer 50b are the same material or different materials.

In another embodiment, the dielectric stack 50 further includes a top dielectric layer (not shown) between the first sub-layer 50a (and/or the second sub-layer 50b) and the second electrode 30. In other words, the first sub-layers 50a and the second sub-layers 50b are formed on the semiconductor stack 12 first, and then the top dielectric layer is formed. The thickness of the top dielectric layer is greater than the thickness of the first sub-layer 50a and the second sub-layer 50b. In one embodiment, the top dielectric layer can be formed by a process different from that for forming the first sub-layer 50a and the second sub-layer 50b. For example, the top dielectric layer is formed by chemical vapor deposition (CVD), and the first sub-layers 50a and the second sub-layers 50b are formed by sputtering.

In another embodiment, the dielectric stack 50 includes the plurality of groups of the dielectric layers and the under dielectric layer and/or the top dielectric layer.

Next, the electrodes are formed. The electrode includes the first electrode 20 and the second electrode 30. The material of the electrode includes metals, such as chromium (Cr), titanium (Ti), gold (Au), aluminum (Al), copper (Cu), tin (Sn), nickel (Ni), rhodium (Rh), tungsten (W), indium (In), platinum (Pt), or an alloy or a laminated stack of the above materials. The first electrode 20 is formed on the dielectric stack 50 and is electrically connected to the first semiconductor layer 121 through the opening 501. The second electrode 30 is formed on the dielectric stack 50 and is electrically connected to the second semiconductor layer 122 through the opening 502. After the subsequent dicing process is completed and the light-emitting element 1 is formed, the first electrode 20 and the second electrode 30 are bonded to a circuit on a carrier board (not shown) in a flip-chip form to be connected with external electronic components or external power supply. The dicing process will be described in detail later. The light generated by the light-emitting element 1 is reflected by the dielectric stack 50 and/or the electrodes (the first electrode 20 and the second electrode 30) and extracted from the light-emitting surface (e.g. the lower surface of the base), so that the brightness of the light-emitting element 1 is improved.

Figure 4B:
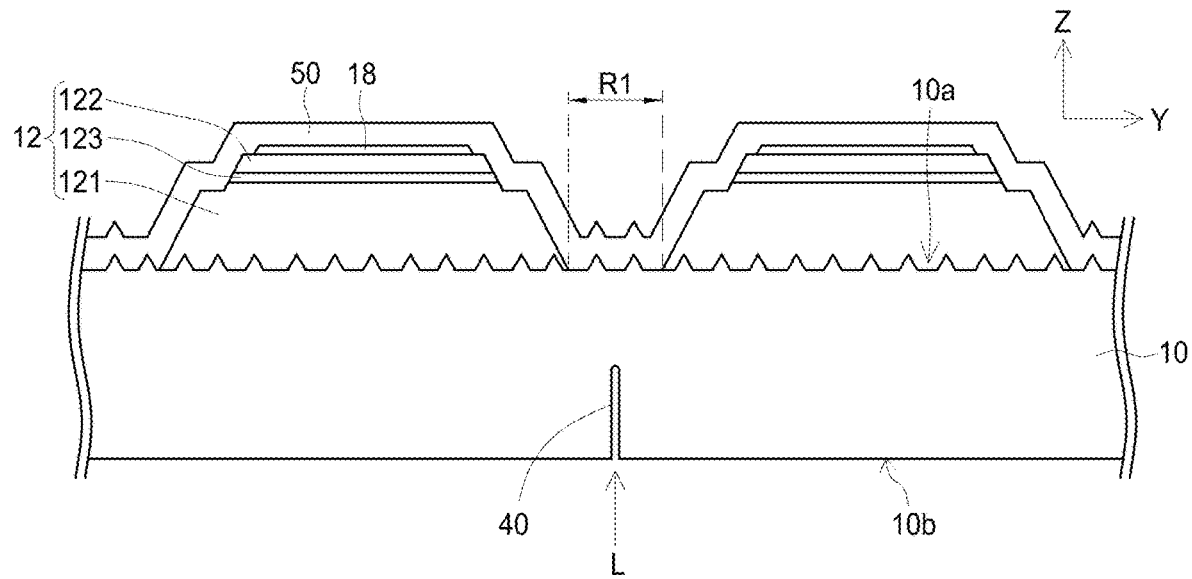
FIGS. 4B to 4D show cross-sectional views of each step of a manufacturing method of the light-emitting element 1 in accordance with an embodiment of the present disclosure.
Figure 4C:
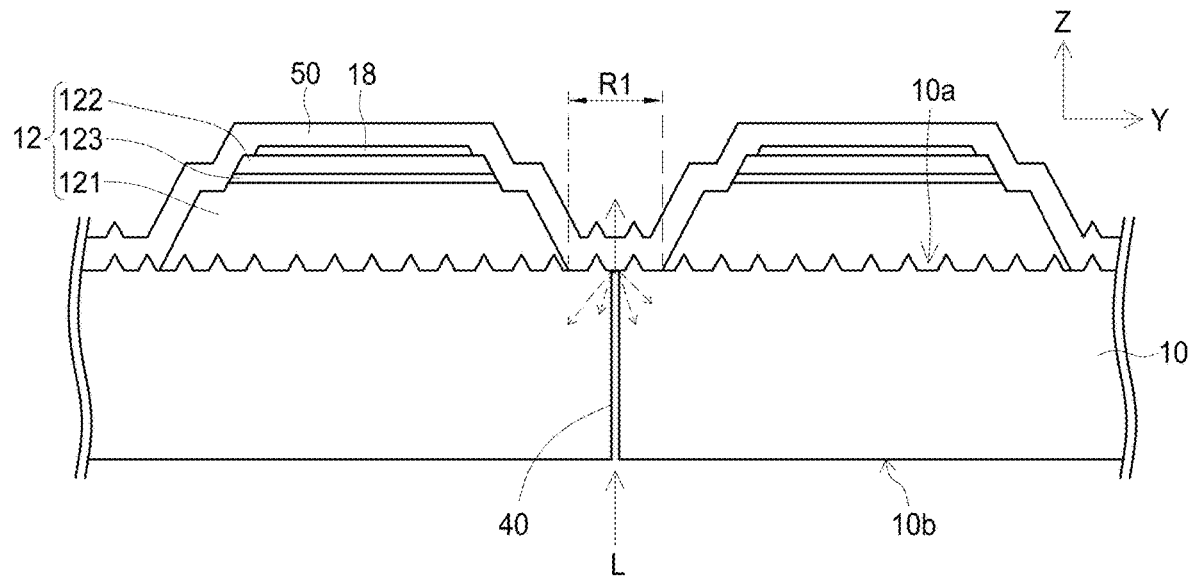
Figure 4D:
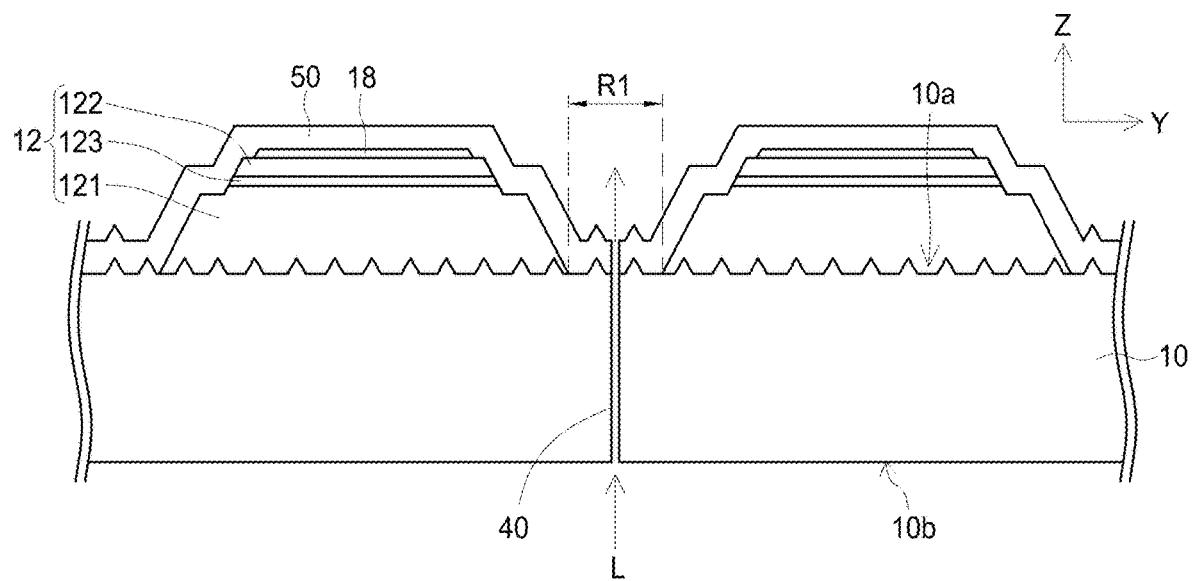
Figure 6:
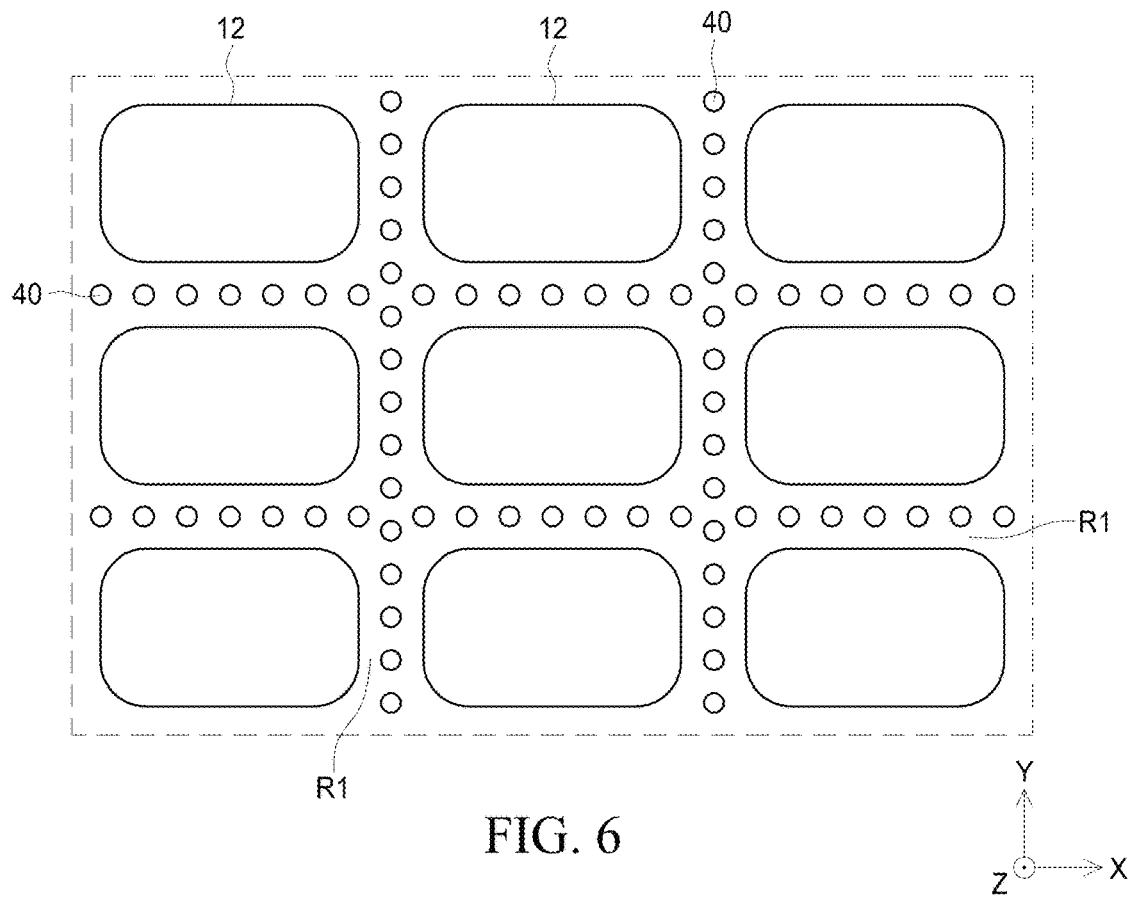
FIG. 6 shows a partial top view of a manufacturing method for the light-emitting element 1 in accordance with an embodiment of the present disclosure.

FIGS. 4B to 4D show cross-sectional views taken along the A-A' line in FIG. 2 of each steps in the following dicing process. After the electrodes are formed, as shown in FIG. 4B, a laser L irradiates on the lower surface 10b of the base 10. In one embodiment, before performing the laser irradiation, the thickness of the base 10 is reduced by grinding or the like. Here, the lower surface of the thinned base 10 is also labeled as 10b. As shown in FIG. 4B and FIG. 6, the laser L enters the base 10 from the lower surface 10b and irradiates the isolation region R1 along the z-direction. The laser energy can damage and modify the inside of the base 10. In one embodiment, the inside of the base 10 is modified. For example, the inside of the base 10 is vaporized by the laser L and forms a hole 40 extending inward from the lower surface 10b of the base 10, and wherein the inner wall of the hole 40 is the modified region. In another embodiment, the laser L does not form the hole, but simply forms a fragile structure with a modified region by, for example, deteriorating or melting the inside of the base. The modified region inside the base 10 extends along the traveling path of the laser, such as from the lower surface 10b to the upper surface 10a. Then, as shown in FIG. 4C, as the laser L travels inside the base 10, parts of the laser energy is reflected by the dielectric stack 50 at or close to the interface between the upper surface 10a of the base 10 and the dielectric stack 50 in the isolation region R1. Then, as shown in FIG. 4D and FIG. 6, the laser L enters the dielectric stack 50 from the hole 40 and finally penetrates through the base 10 and the dielectric stack 50. The laser L irradiates the isolation region R1 along the z-direction so the holes 40 also correspond to the isolation region R1 and surround the semiconductor stack 12 in the top view shown in FIG. 6. In the top view, the arrangement of the holes 40 can be continuous or discontinuous. For example, by adjusting the frequency, speed, energy, and spot width of the laser L, when the holes 40 connect each other, the holes can be regarded as a continuous arrangement. When the holes are separated with each other by a distance, the holes can be regarded as a discontinuous arrangement. The continuous or discontinuous holes 40 arranged in the isolation region R1 constitute a pre-defined dicing line (not shown in the figure). Finally, the semiconductor wafer WF1 is divided into a plurality of light-emitting elements 1 along the pre-defined dicing line by an external force from sources like an expansion tape or a breaking tool.

Since the pre-defined dicing line is composed of the plurality of holes 40 penetrating the base 10 and the dielectric stack 50 in the z-direction, when the semiconductor wafer WF1 is separated by the external force, the base 10 can be split following the holes 40. The unintended crack formation or the degree of unintended crack of the base 10 after dicing can be minimized. As the size of the light-emitting element becomes smaller, the proportion of light extracted from the side wall of the base increases. Reducing the unintended crack of the base can make the light emission of the light-emitting element in the x-direction and the y-direction more symmetrical and uniform. In one embodiment, the thickness of the base is less than or equal to 100 μm. In another embodiment, the thickness of the base is less than or equal to 80 μm. In one embodiment, the size of the light-emitting element 1, that is, the horizontal area of the light-emitting element 1 on the x-y plane is less than or equal to 70,000 μm². In another embodiment, the horizontal area of the light-emitting element 1 on the x-y plane is between 6000 μm² and 40,000 μm².

In one embodiment, the energy, frequency, speed, etc. of the laser applied on the isolation regions R1 in the x-direction and the y-direction can be different. Because the material characteristic of the base 10 such as lattice structure, unintended crack may be more easily created in the base 10 in one of the x-direction and the y-direction than in the other one of the x-direction and the y-direction. A laser with higher frequency and/or higher energy can be used in the direction in which the unintended crack is more easily created, so that the unintended crack formation or the degree of unintended crack of the base 10 in that direction can be reduced.

In another embodiment, different laser dicing processes are performed in the x-direction and the y-direction. For example, the laser dicing process disclosed in the present embodiment is performed in the direction in which the unintended crack is more easily created, and other laser dicing process, such as UV laser dicing or stealth laser dicing, is performed in the other direction in which the unintended crack is hardly created, so that the unintended crack formation or the degree of unintended crack of the base 10 can be reduced.

The semiconductor stack 12 is formed on the upper surface 10a of the base, and the energy of the laser L may damage the semiconductor stack 12 near the isolation region R1. In the present embodiment, the dielectric stack 50 reflects the light generated from the light-emitting element 1 and improves the brightness of the light-emitting element 1. In addition, the dielectric stack 50 disposed on the isolation region R1 partially reflects and partially transmits the laser energy. As a result, the dielectric stack 50 prevents the laser energy from damaging the semiconductor stack 12 and causing the light-emitting element 1 to fail. The laser L is also used to cut through the dielectric stack 50 to divide the semiconductor wafer WF1 into the plurality of light-emitting elements 1.

Figure 7:
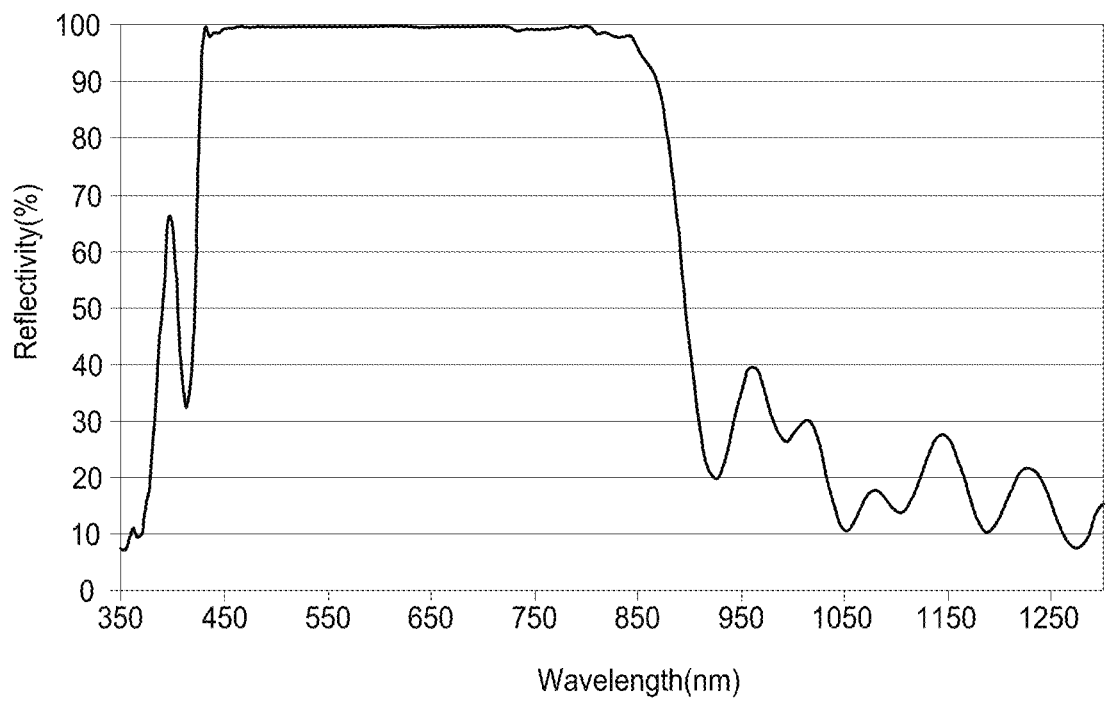
FIG. 7 shows a reflectance spectrum of a dielectric stack of the light-emitting element 1 in accordance with an embodiment of the present disclosure.

FIG. 7 shows a reflectance spectrum of the dielectric stack of the light-emitting element 1 in accordance with an embodiment of the present disclosure. As mentioned above, the dielectric stack 50 serves as the reflective structure of the light-emitting element 1 and has a high reflectance for the light generated from the semiconductor stack 12. In the present embodiment, the semiconductor stack 12 emits a light with a dominant wavelength $\lambda_D$, which can be in the range of 450 nm to 550 nm. The dielectric stack 50 has a reflectance of more than 90% for the light with the wavelength $\lambda_D$. In another embodiment, $\lambda_D$ is in the range of visible light, for example, the wavelength ranges from 430 nm to 700 nm, and the dielectric stack 50 has a reflectance of more than 90% for the light with the wavelength $\lambda_D$. Besides, during the dicing process, the dielectric stack 50 can protect the semiconductor stack 12. The dielectric stack 50 has a reflectance of 10%-50% and/or a transmittance of 50%-90% for the laser L. In the present embodiment, the laser L is an infrared light, and the wavelength of the laser is between 800 nm and 1100 nm. In one embodiment, the wavelength of the laser L is between 1000 nm and 1100 nm. If the dielectric stack 50 has a reflectance of less than 10% and/or a transmittance of more than 90% for the laser L, the energy of the laser L may penetrate the dielectric stack 50 and damage the semiconductor stack 12. If the dielectric stack 50 has a reflectance of more than 50% and/or a transmittance of less than 50% for the laser L, most of the laser energy may be reflected by the dielectric stack 50 and cannot cut through the dielectric stack 50 effectively.

FIG. 1 shows the light-emitting element 1 formed by the manufacturing method in accordance with the present embodiment of the disclosure. After the isolation region R1 in the semiconductor wafer WF1 is separated, the isolation region R1' in the light-emitting element 1 is formed, which is located around the light-emitting element 1 and surrounds the semiconductor stack 12. The base 10 includes a first side wall S1, a second side wall S2, a third side wall S3, and a fourth side wall S4. The first side wall S1 is opposite to the third side wall S3 and the second side wall S2 is opposite to the fourth side wall S4. The included angle between the first side wall S1 and the lower surface 10b is θ1 and the included angle between the third side wall S3 and the lower surface 10b is θ3, and wherein θ1 and θ3 are 90±5 degrees. In one embodiment, θ1 and θ3 are 90±3 degrees. The holes 40 formed by the laser in the manufacturing method lead the splitting of the base 10 so that the difference between θ1 and θ3 is less than 5 degrees. The first side wall S1 and the third side wall S3 are almost perpendicular or substantially perpendicular with the lower surface 10b. In this way, the emission angle of the light-emitting element 1 in the x-direction is symmetrical or nearly symmetrical. Similarly, the included angle between the second side wall S2 and the lower surface 10b and the included angle between the fourth side wall S4 and the lower surface 10b are 90±5 degrees. In one embodiment, the included angle between the second side wall S2 and the lower surface 10b and the included angle between the fourth side wall S4 and the lower surface 10b are 90±3 degrees. In one embodiment, the difference between the included angle between the second side wall S2 and the lower surface 10b and the included angle between the fourth side wall S4 is less than 5 degrees. By keeping the difference between the included angle between the second side wall S2 and the lower surface 10b and the included angle between the fourth side wall S4 and the lower surface 10b less than 5 degrees, the emission angle of the light-emitting element 1 in the y-direction is symmetrical or nearly symmetrical.

Figure 8A:
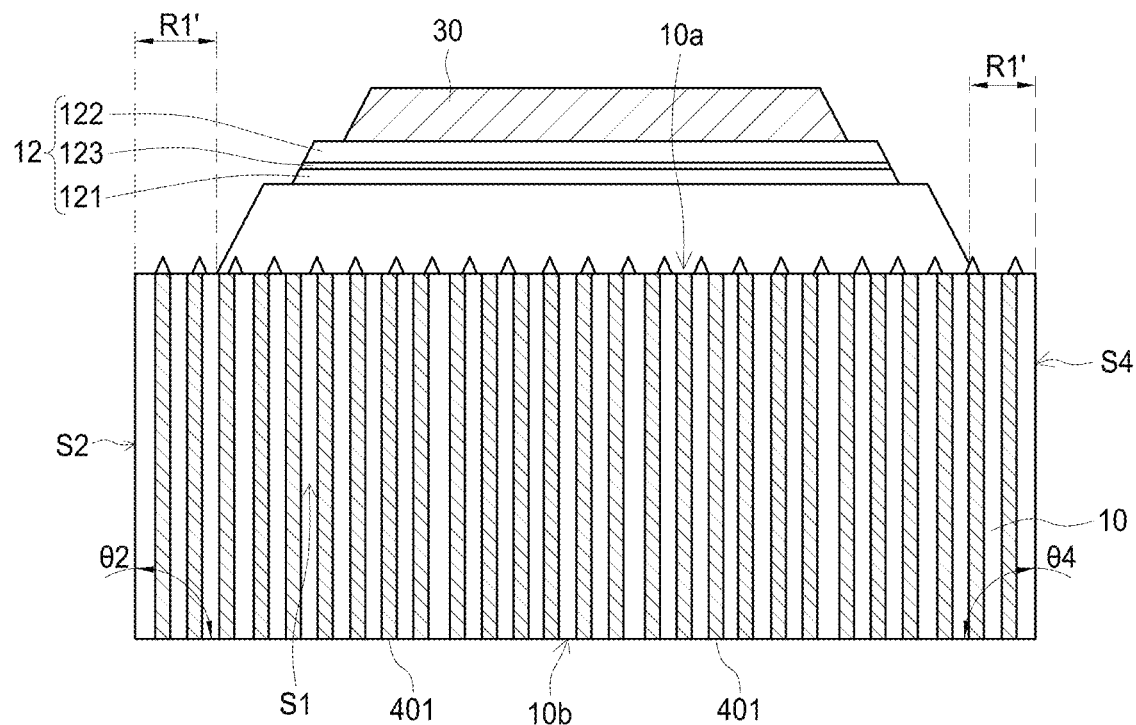
FIG. 8A shows a schematic appearance of the light-emitting element 1 in accordance with an embodiment of the present disclosure.
Figure 8B:
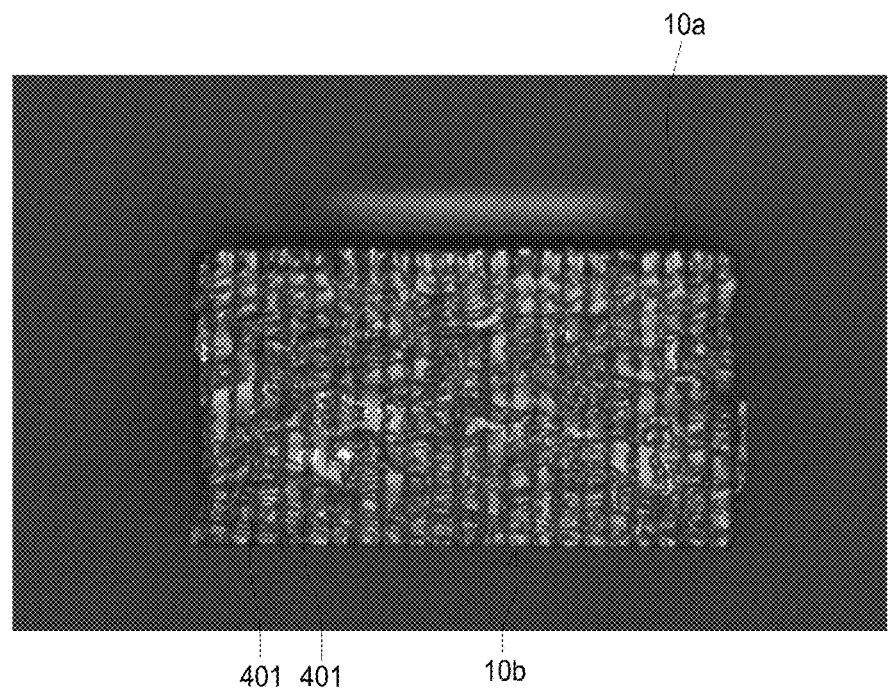
FIG. 8B shows an appearance image of the light-emitting element 1 in accordance with an embodiment of the present disclosure.

FIG. 8A shows a schematic appearance of the light-emitting element 1 viewed from the x-direction in FIG. 1. As an example, in order to clearly show the characteristics of the embodiments of the present application, the dielectric stack 50 and the transparent conductive layer 18 are not shown in FIG. 8A. In addition, FIG. 8A is not drawn to the scale of actual element. In the drawing, the shapes and thicknesses of the components may be depicted on an exaggerative scale for ease of understanding. FIG. 8B shows an appearance image of the light-emitting element 1 viewed from the x-direction in FIG. 1.

As shown in FIGS. 8A and 8B, a plurality of modified regions 401 is formed on the first side wall S1 401 and extends upward from the lower surface 10b. In one embodiment, the plurality of modified regions 401 respectively extend from the lower surface 10b to the upper surface 10a or from the upper surface 10a to the lower surface 10b. In the manufacturing method in accordance with the embodiment of the present disclosure, the laser L travels insides the base 10 and creates the holes 40, and then the semiconductor wafer WF1 is divided into the light-emitting elements 1 following the holes 40. The inner wall of the hole 40 forms the modified region 401 of the light-emitting element 1 after splitting the semiconductor wafer WF1. Therefore, the position of the modified region 401 corresponds to the position of the hole 40 shown in FIG. 4D and FIG. 6. The extending direction of the modified region 401 is the same as the direction of the laser L traveling inside the base 10. For example, the extending direction of the modified region 401 is perpendicular to the lower surface 10b. In one embodiment, one end of the modified region 401 is connected to the lower surface 10b, and one of the plurality of modified regions 401 extends upward from the lower surface 10b to the upper surface 10a or extends from the upper surface 10a to the lower surface 10b. In one embodiment, one part of the plurality of modified regions 401 extends continuously between the upper surface and lower surface on the side wall. Other parts of the plurality of modified regions 401 are divided into upper portion and lower portion on the side wall, and no modified region is located on the side wall between the upper portion and lower portion. The upper portion and lower portion are separated and discontinuous. In one embodiment, the portion of the first side wall S1 located between adjacent modified regions 401 is irregular. In one embodiment, the gaps between adjacent modified regions 401 on the side wall are substantially the same.

In the present application, although the appearance images of the second side wall S2, the third side wall S3, and the fourth side wall S4 of the light-emitting element 1 viewed from different directions are not shown, people skills in the art can understand by the description in the present application that the modified regions 401 can also be formed on the second side wall S2, the third side wall S3, and the fourth side wall S4.

As described in the dicing process of the aforementioned embodiment, the laser applied to the isolation regions along the x-direction and the y-direction may have different laser spot width, energy, frequency, and speed. Therefore, in an embodiment, the modified regions 401 on the side walls in different directions have different gaps. For example, the gaps between the modified regions 401 on the second sidewall S2 and the fourth sidewall S4 are different from the gaps between the modified regions 401 on the first side wall S1 and the third side wall S3. In another embodiment, the modified region 401 on the side walls in different directions has different surface roughness. For example, the surface roughness of the modified region 401 on the second side wall S2 and the fourth side wall S4 is different from the surface roughness of the modified region 401 on the first side wall S1 and the third side wall S3. In another embodiment, the modified regions 401 on the side walls in different directions have different widths.

Figure 9:
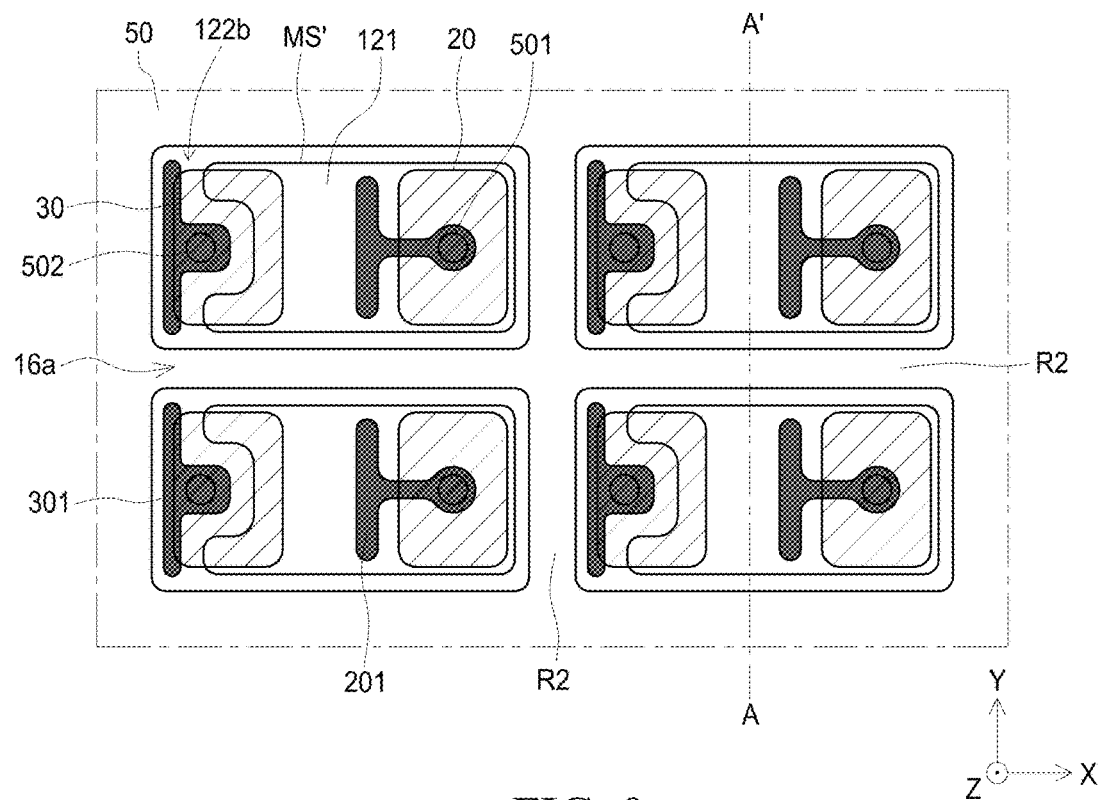
FIG. 9 shows a partial top view of a manufacturing method for a light-emitting element 2 in accordance with another embodiment of the present disclosure.
Figure 10A:
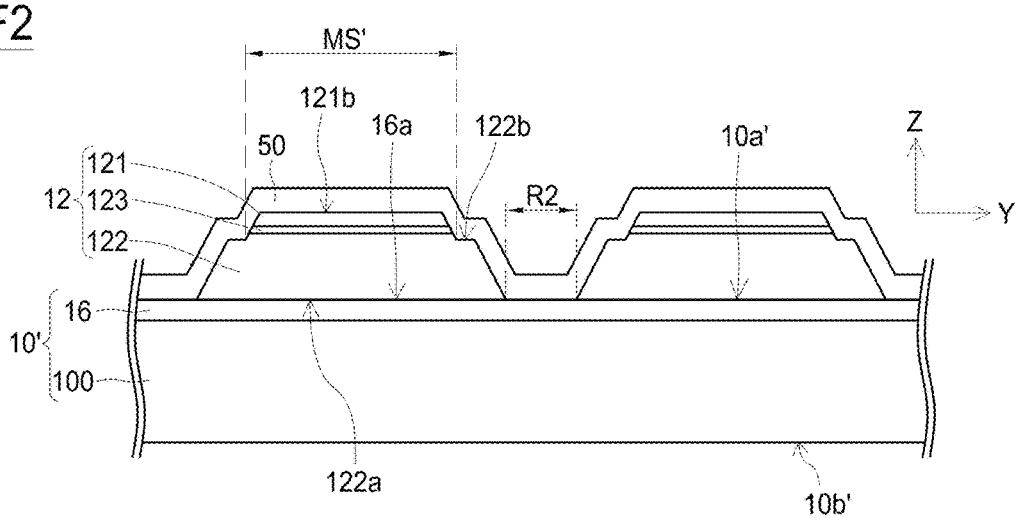
FIG. 10A shows a cross-sectional view taken along the A-A' line in FIG. 9.
Figure 11:
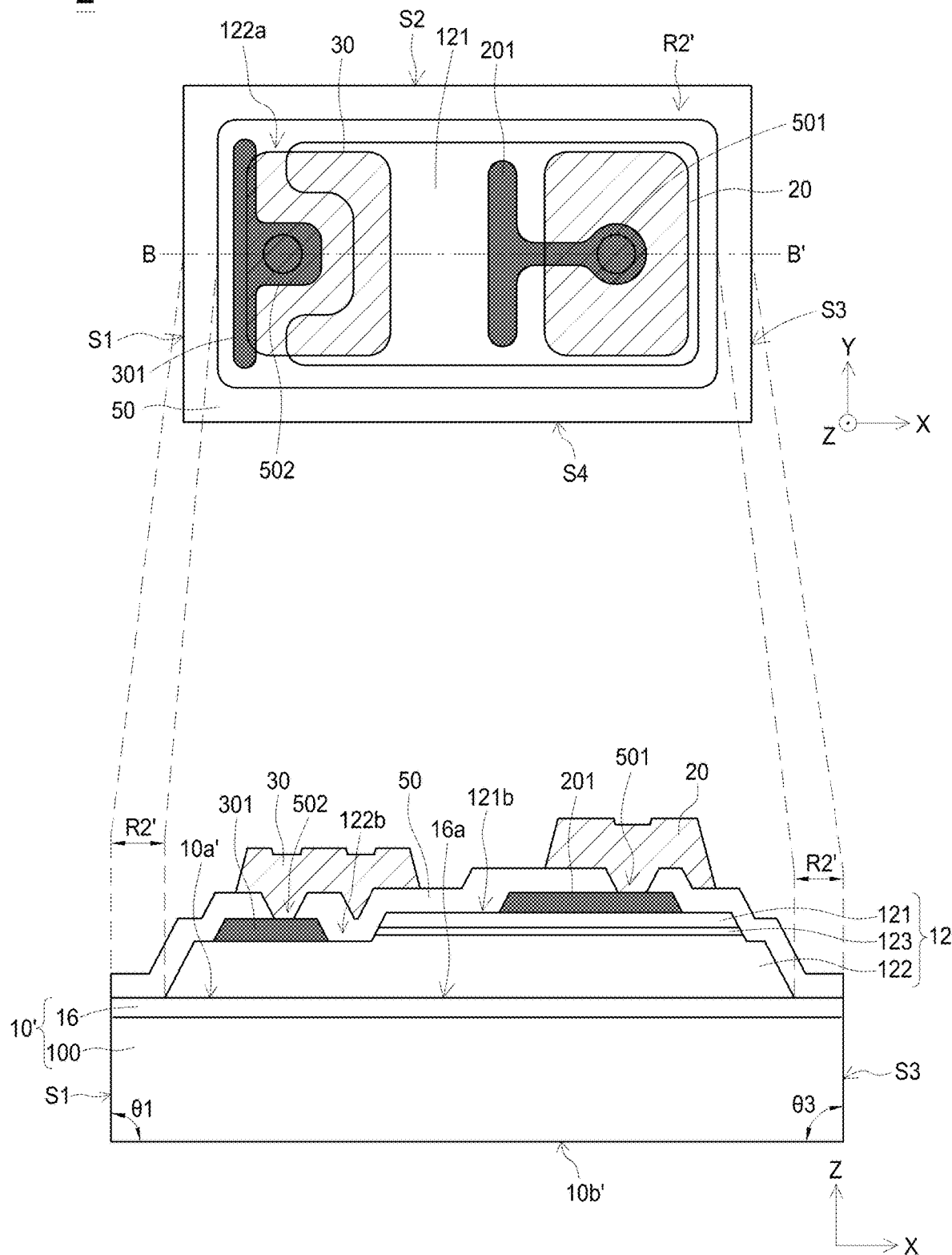
FIG. 11 shows a top view and a cross-sectional view of the light-emitting element 2 in accordance with an embodiment of the present disclosure.

In another embodiment of the present application, the semiconductor stack can be formed on the base by different methods. For example, a manufacturing method for a light-emitting element 2 in accordance with another embodiment includes forming the semiconductor stack 12 on the base 10' by bonding, and then similar to the manufacturing method for the light-emitting element 1, the steps of forming mesas, forming the isolation region, forming the dielectric stack, forming the electrodes and the dicing process are performed. FIG. 11 shows a top view and a cross-sectional view taken along the B-B' line of the light-emitting element 2. FIG. 9 shows a partial top view of the manufacturing method for the light-emitting element 2 in accordance with another embodiment of the present disclosure. FIG. 10A shows a cross-sectional view taken along the A-A' line in FIG. 9. Referring to FIG. 10A, a bonding layer 16 is formed between the semiconductor stack 12 and a carrier 100. After the semiconductor stack 12 is formed on a growth substrate (not shown) by epitaxy growth, the upper surface 122a of the second semiconductor layer 122 of the semiconductor stack 12 is bonded to the carrier 100 by the bonding layer 16, and then the growth substrate is removed to expose the surface 121b of the first semiconductor layer 121. The bonding layer 16 and the carrier 100 constitute the base 10'.

The bonding layer 16 is transparent to the light generated by the semiconductor stack 12 and the material thereof can be insulating material and/or conductive material. The insulating material includes polyimide (PI), benzocyclobutene (BCB), perfluorocyclobutane (PFCB), magnesium oxide (MgO), Sub, epoxy, acrylic resin, cyclic olefin polymer (COC), polymethyl methacrylate (PMMA), polyethylene terephthalate (PET), polycarbonate (PC), polyetherimide, fluorocarbon polymer, glass, aluminum oxide, silicon oxide, titanium oxide, tantalum oxide, silicon nitride or spin-on glass (SOG). The conductive material includes indium tin oxide (ITO), indium oxide (InO), tin oxide (SnO), cadmium tin oxide (CTO), antimony tin oxide (ATO), aluminum zinc oxide (AZO), zinc tin oxide (ZTO), zinc oxide (ZnO), indium zinc oxide (IZO), diamond-like carbon (DLC) or gallium zinc oxide (GZO). The carrier 100 is transparent to the light generated by the semiconductor stack 12, and its materials include conductive materials, composite materials, metal matrix composite (MMC), ceramic matrix composite (CMC), polymer matrix composite or insulating material. The insulating material includes sapphire, diamond, glass, polymer, epoxy, quartz, acryl, or $Al_2O_3$. In the present embodiment, the base in the manufacturing method and the base of the light-emitting element 2 are represented by the same symbols. The base 10' and the semiconductor stack 12 formed thereon constitute a semiconductor wafer WF2.

Next, the mesas are formed. The mesas (MS') are formed by removing portions of the active region 123 and the first semiconductor layer 121 to expose the surface 122b of the second semiconductor layer 122. In the top view, the surface 122b surrounds each mesa MS'.

As shown in FIG. 9, a first extension electrode 201 is formed on the first semiconductor layer 121, and a second extension electrode 301 is formed on the surface 122b of the second semiconductor layer 122. In the step of forming the isolation region R2, the second semiconductor layer 122 is removed from the surface 122b of the second semiconductor layer 122 to expose the upper surface 16a of the bonding layer 16; that is, to expose the upper surface 10a' of the base 10', thereby forming the isolation region R2. The isolation region R2 separates the semiconductor stack 12 and defines a plurality of light-emitting elements 2. The isolation region R2 marks the location of the pre-defined dicing line (not shown) in the subsequent dicing process. In another embodiment, the second semiconductor layer 122 and the bonding layer 16 are removed from the surface 122b of the second semiconductor layer 122 to expose the upper surface of the carrier 100, thereby forming the isolation region R2.

After forming the isolation region R2, the dielectric stack 50 is formed. Being the same as the manufacturing method for the light-emitting element 1, the dielectric stack 50 is formed on the upper surfaces and side walls of each semiconductor stacks 12, and on the isolation region R2. The separated openings 501 and 502 are formed in the dielectric stack 50 by the method such as etching and lithography. The difference from the manufacturing method for the light-emitting element 1 is that the opening 501 exposes the first extension electrode 201 thereunder, and the opening 502 exposes the second extension electrode 301. The structure, material, and function of the dielectric stack 50 are the same as those in the previous embodiment, and the details are not repeated.

Next, the electrodes are formed. The first electrode 20 is formed on the dielectric stack 50 and is electrically connected to the first semiconductor layer 121 through the opening 501. The second electrode 30 is formed on the dielectric material stack 50 and is electrically connected to the second semiconductor layer 122 through the opening 502. After the subsequent dicing process is completed and the light-emitting element 2 is formed, the first electrode 20 and the second electrode 30 are bonded to a circuit on a carrier board (not shown) in a flip-chip form. The light-emitted from the light-emitting element 2 is reflected by the dielectric stack 50 and/or the electrodes (the first electrode 20 and the second electrode 30) and extracted from the light-emitting surface, so that the brightness of the light-emitting element 2 is improved.

Figure 10B:
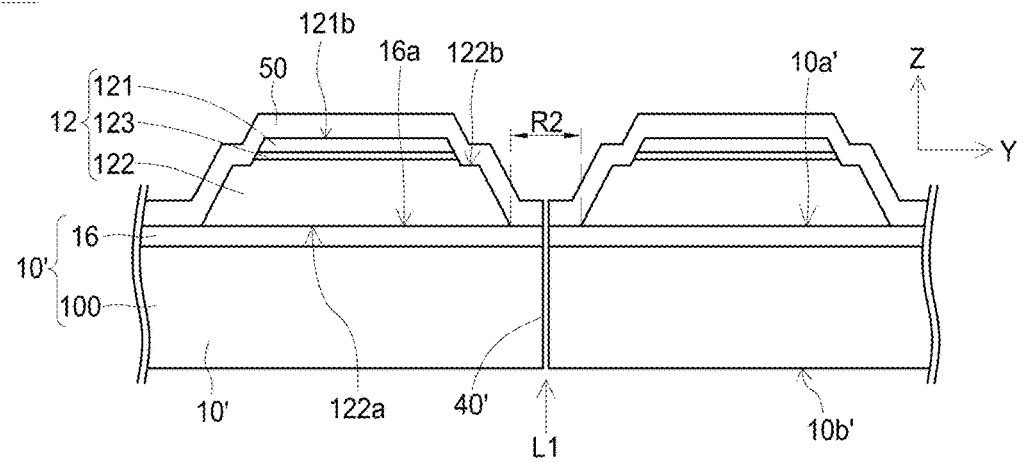
FIGS. 10B to 10C show cross-sectional views of each step of a manufacturing method for the light-emitting element 2 in accordance with another embodiment of the present disclosure.
Figure 10C:
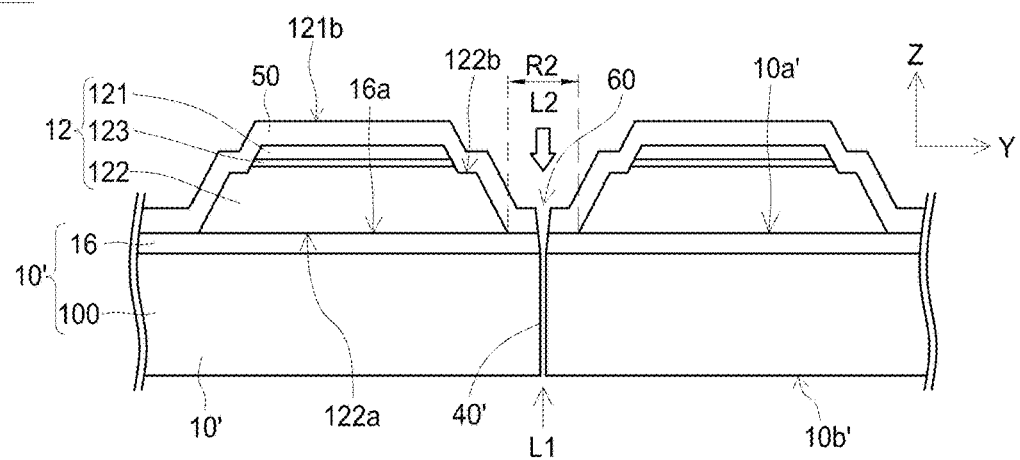

FIGS. 10B to 10C show cross-sectional views taken along the A-A' line in FIG. 9 in each step of the dicing process for the light-emitting element 2. After the electrodes are formed, as shown in FIG. 10B, a first laser L1 is applied to the lower surface 10b' of the base 10' (i.e. the lower surface of the carrier 100). In one embodiment, before performing the first laser irradiation, the thickness of the carrier 100 is reduced by grinding or the like. Here, the lower surface of the thinned carrier 100 is also labeled as 10b'. As shown in FIG. 10B, the first laser L1 enters the base 10' from the lower surface 10b' and irradiates the isolation region R2 along the z-direction. The laser energy can damage and modify the inside of the carrier 100. In one embodiment, the inside of the carrier 100 is modified to form a plurality of holes 40' extended inward from the lower surface 10b' of the carrier 100, and the inner wall of the hole 40' is the modified region inside the base 10' (i.e. the carrier 100). Then, the first laser L1 enters the inside of the dielectric stack 50 via the hole 40' and finally penetrates through the base 10' and the dielectric stack 50. That is, the first laser L1 penetrates the carrier 100, the bonding layer 16 and the dielectric stack 50. In another embodiment, the first laser L1 does not penetrate the dielectric stack 50. In another embodiment, the first laser L1 does not penetrate the bonding layer 16 and the dielectric stack 50. In one embodiment, the second semiconductor layer 122 and the bonding layer 16 are removed to expose to the upper surface of the carrier 100 and to form the isolation region R2, and the first laser L1 penetrates the carrier 100 and the dielectric stack 50 formed on the isolation region R2.

Being the same as the manufacturing method for the light-emitting element 1, as the first laser L travels inside the base 10', parts of the laser energy is reflected by the dielectric stack 50 at or close to the interface between the upper surface 10a' of the base and the dielectric stack 50 in the isolation region R2. The dielectric stack 50 prevents the first laser energy from damaging the semiconductor stack 12 that may cause the failure of the light-emitting element 2. In the present embodiment, similar to the dicing process for the light-emitting element 1, the continuous or discontinuous holes 40' arranged along the isolation region R2 constitute the pre-defined dicing line. The method of irradiating the first laser L1 is the same as that of irradiating the laser L in the dicing process for the light-emitting element 1 described above and is not repeated here.

Next, as shown in FIG. 10C, a second laser L2 is applied to the upper surface 10a' of the base 10'. The second laser L2 irradiates the isolation region R2 along the negative z-direction and the pre-defined dicing line to form a plurality of grooves 60 in the dielectric stack 50 and the base 10' in the isolation region R2. In one embodiment, the groove 60 extends downward from the upper surface of the dielectric stack 50, penetrates the bonding layer 16, and enters part of the carrier 100. In another embodiment, the groove 60 extends downward from the upper surface of the dielectric stack 50 to the bonding layer 16. The groove 60 is V-shaped or U-shaped in a cross-sectional view, and the depth of the groove 60 is between 2 μm and 50 μm. In one embodiment, the wavelength of the second laser L2 is in a range of that of, for example, a UV light. By controlling the frequency, speed, energy and other parameters of the second laser L2, the plurality of grooves 60 can be arranged continuously or discontinuously. Using the second laser L2 to form the groove 60 passing through the bonding layer 16 or reaching the bonding layer 16 can prevent the bonding layer 16 from cracking during the dicing process or the subsequent splitting process, which weakens the adhesion force between the semiconductor stack 12 and the carrier 100.

In another embodiment, the second laser L2 can be omitted.

Finally, the semiconductor wafer WF2 is divided into a plurality of light-emitting elements 2 along the pre-defined dicing line by an external force so the light-emitting elements 2 shown in FIG. 11 are formed. The light-emitting element 2 includes a base 10', the semiconductor stack 12 formed on the upper surface 10a' of the base 10' and bonded to the carrier 100 by the bonding layer 16. The first extension electrode 201 is formed on the first semiconductor layer 121 and the second extension electrode 301 is formed on the second semiconductor layer 122. The dielectric stack 50 covers the semiconductor stack 12 and includes openings 501 and 502 respectively exposing the first extension electrode 201 and the second extension electrode 301. The first electrode 20 is formed on the dielectric stack and electrically connected to the first semiconductor layer 121 through the opening 501, and the second electrode 30 is formed on the dielectric stack 50 and electrically connected to the second semiconductor layer 122 through the opening 502.

After the isolation region R2 in the semiconductor wafer WF2 is separated, the isolation region R2' in the light-emitting element 2 is formed, which is located around the light-emitting element 2 and surrounds the semiconductor stack 12. The base 10' includes a first side wall S1, a second side wall S2, a third side wall S3, and a fourth side wall S4. The first side wall S1 is opposite to the third side wall S3, and the second side wall S2 is opposite to the fourth side wall S4. The included angle between the first side wall S1 and the lower surface 10b' is θ1 and the included angle between the third side wall S3 and the lower surface 10b' is θ3, and wherein θ1 and θ3 are 90±5 degrees. In one embodiment, θ1 and θ3 are 90±3 degrees. The holes 40' formed by the laser in the manufacturing method lead the splitting of the base 10' so that the difference between θ1 and θ3 is less than 5 degrees, which means the first side wall S1 and the third side wall S3 are almost perpendicular or substantially perpendicular with the lower surface 10b'. Therefore, the emission angle of the light-emitting element 2 in the x-direction is symmetrical or nearly symmetrical. Similarly, the included angle between the second side wall S2 and the lower surface 10b' and the included angle between the fourth side wall S4 and the lower surface 10b are 90±5 degrees. In one embodiment, the included angle between the second side wall S2 and the lower surface 10b' and the included angle between the fourth side wall S4 and the lower surface 10b are 90±3 degrees. In one embodiment, the difference between the included angle between the second side wall S2 and the lower surface 10b' and the included angle between the fourth side wall S4 is less than 5 degrees. By keeping the difference between the included angle between the second side wall S2 and the lower surface 10b' and the included angle between the fourth side wall S4 and the lower surface 10b' less than 5 degrees, the emission angle of the light-emitting element 2 in the y-direction is symmetrical or nearly symmetrical. In one embodiment, the thickness of the base 10' of the light-emitting element 2 is less than or equal to 100 μm. In another embodiment, the thickness of the base is less than or equal to 80 μm. In one embodiment, the horizontal area of the light-emitting element 2 on the x-y plane is less than or equal to 70,000 μm$^2$. In another embodiment, the horizontal area of the light-emitting element 2 on the x-y plane is between 6000 μm$^2$ and 40,000 μm$^2$.

Figure 12:
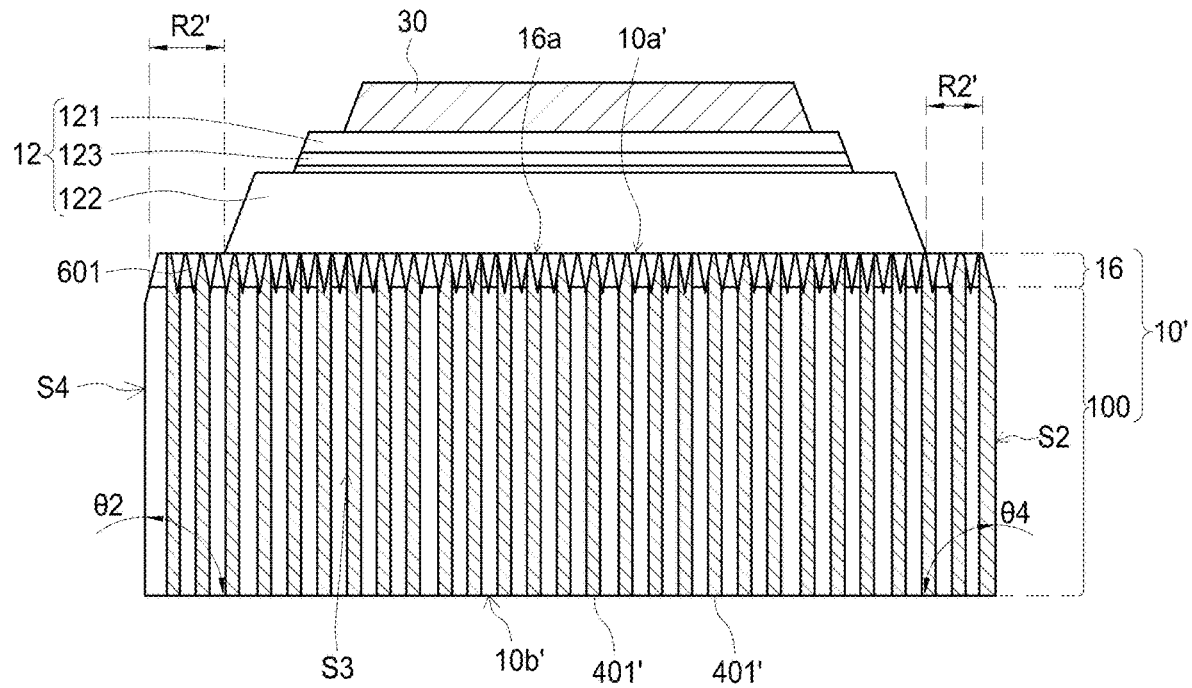
FIG. 12 shows a schematic appearance of the light-emitting element 2 in accordance with an embodiment of the present disclosure.

FIG. 12 shows a schematic appearance of the light-emitting element 2 viewed from the negative x-direction in FIG. 11. As an example, in order to clearly show the characteristics of the embodiments of the present application, the first extension electrode 201, the dielectric stack 50 and the first electrode 20 are not shown in FIG. 12. In addition, FIG. 12 is not drawn to the scale of actual element. In the drawing, the shapes and thicknesses of the components may be depicted on an exaggerative scale for ease of understanding.

Being the same as the first light-emitting element 1, as shown in FIG. 12, a plurality of modified regions 401' extending from the lower surface 10b' to the upper surface 10a' or from the upper surface 10a' to the lower surface 10b' is formed on the third side wall S3. In the manufacturing method in accordance with the present embodiment of the present application, the first laser L1 travels insides the base 10' and creates the holes 40', and then the semiconductor wafer WF2 is divided into the light-emitting elements 2 following the holes 40'. The inner wall of the hole 40' forms the modified region 401' of the light-emitting element 2 after splitting the semiconductor wafer WF2. Therefore, the position of the modified region 401' corresponds to the position of the hole 40'. In addition, a plurality of modified regions 601 extending from the upper surface 10a' of the base downward to the bonding layer 16 or to the carrier 100 is formed on the third side wall S3. Through the manufacturing method of the present embodiment, the second laser L2 is applied along the pre-defined dicing line to form the grooves 60 in the dielectric stack 50 and the base 10' in the isolation region R2. The inner wall of the groove 60 forms the modified region 601 after the semiconductor wafer WF2 is divided into the plurality of light-emitting elements 2. Therefore, the position of the modified region 601 corresponds to the position of the groove 60. In one embodiment, the length of the modified region 601 in the z-direction, that is, the length of the modified region 601 in the thickness direction of the base 10' is between 2 μm and 50 μm. In one embodiment, the lower part of the modified region 601 includes a tip, and the upper part of the modified region 601 can be connected to the adjacent modified region 601. In one embodiment, the gap between the tips of adjacent modified regions 601 is between 1 μm and 50 μm.

In the present application, although the schematic appearances of the first side wall S1, the second side wall S2, and the fourth side wall S4 of the light-emitting element 2 viewed from different directions are not shown, people skills in the art can understand by the description in the present application that the modified regions 401' and 601' can also be formed on the first side wall S1, the second side wall S2, and the fourth side wall S4.

As described in the dicing process of the aforementioned embodiment, the laser applied to the isolation regions along the x-direction and the y-direction may have different laser spot width, energy, frequency, and speed. Therefore, in an embodiment, the modified regions 401' on the side walls in different directions have different gaps. For example, the gap between the modified regions 401' on the second sidewall S2 and the fourth sidewall S4 is different from the gap between the modified regions 40' on the first side wall S1 and the third side wall S3. In another embodiment, the modified region 401' on the side walls in different directions has different surface roughness. For example, the surface roughness of the modified region 401' on the second side wall S2 and the fourth side wall S4 is different from the surface roughness of the modified region 401' on the first side wall S1 and the third side wall S3. In another embodiment, the modified regions 401' on the side walls in different directions have different widths.

In another embodiment of the manufacturing method for light-emitting element 2 without applying the second laser L2, no modified regions 601 are formed on the side walls of the light-emitting element 2.

Figure 13A:
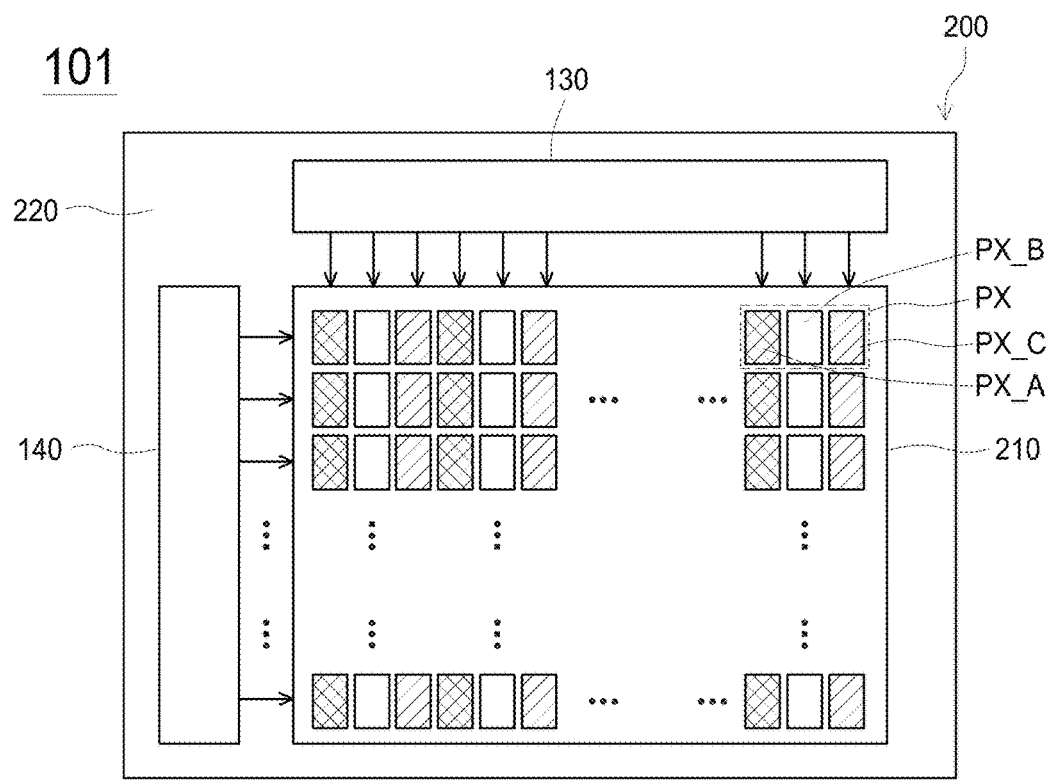
FIG. 13A shows a top view of a display device comprising the light-emitting element in accordance with the embodiments of the present disclosure.

FIG. 13A shows a top view of a display device 101 comprising the light-emitting element in accordance with the embodiments of the present disclosure. As shown in FIG. 13A, the display device 101 includes a substrate 200, wherein the substrate 200 includes a display area 210 and a non-display area 220, and a plurality of pixel units PX are arranged in the display area 210. Each of the pixel unit PX includes a first sub-pixel PX_A, a second sub-pixel PX_B, and a third sub-pixel PX_C. A data driver 130 and a scanning driver 140 are provided in the non-display area 220. The data driver 130 is connected to a data line (not shown) of each pixel unit PX to transmit a data signal to each pixel unit PX. The scanning driver 140 is connected to a scanning line (not shown) of each pixel unit PX to transmit a scanning signal to each pixel unit PX. The pixel unit PX includes the light-emitting element in accordance with the foregoing embodiments of the present application. The sub-pixels emit lights of different colors. In one embodiment, the first sub-pixel PX_A, the second sub-pixel PX_B, and the third sub-pixel PX_C are, for example, a red sub-pixel, a green sub-pixel, and a blue sub-pixel, respectively. The light-emitting elements emitting lights of different wavelengths are different sub-pixels so that the sub-pixels display different colors. In another embodiment, the sub-pixel includes the light-emitting element in accordance with any one of the foregoing embodiments of the present application, and the sub-pixels in the pixel unit PX display different colors by changing the color of the light generated from the light-emitting elements through a wavelength conversion element. The combination of red, green, and blue light generated by each sub-pixel allows the display device 101 to display a full-color image. However, the number and arrangement of the sub-pixels in the pixel unit PX in the present embodiment are not limited to this, and different modes can be implemented according to user's requirements such as color saturation, resolution, and contrast.

Figure 13B:
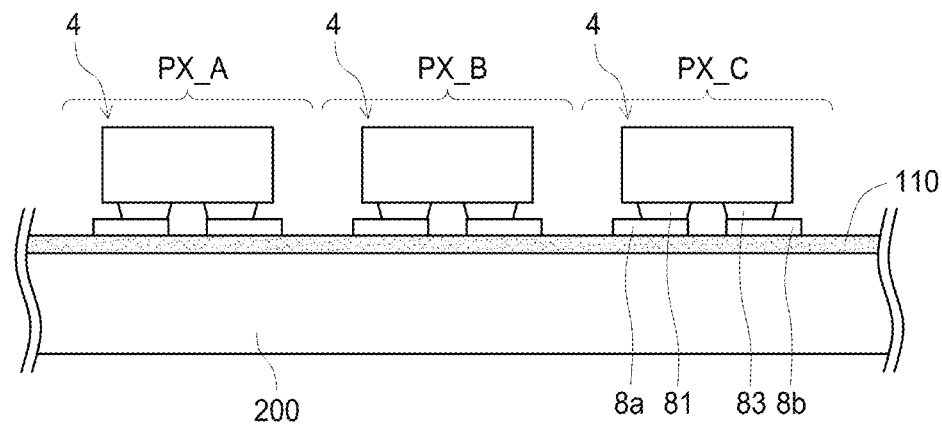
FIG. 13B shows a partial cross-sectional view of the display device in accordance with an embodiment of the present disclosure.

FIG. 13B shows a cross-sectional view of the pixel unit PX in FIG. 13A. The pixel unit PX includes the light-emitting element in accordance with any of the above-mentioned embodiments. In an embodiment, the sub-pixel includes a light-emitting package 4 that includes the light-emitting element disclosed in the above-mentioned embodiments. The light-emitting package 4 is bonded to the substrate 200 in a flip-chip form. A circuit layer 110 and bonding pads 8*a* and 8*b* are located on the substrate 200. The circuit layer 110 is electrically connected to the bonding pads 8*a* and 8*b*. In on embodiment, the circuit layer 110 includes active components, such as transistors. The electrodes 81 and 83 of the light-emitting package 4 are bonded to the bonding pads 8*a* and 8*b* by, for example, soldering, and are electrically connected to the driving circuit (i.e., the data driver 130 and the scanning driver 140) through the circuit layer 110. In this way, the data driver 130, the scanning driver 140, and the circuit layer 110 control the light-emitting elements in the pixel unit PX. In another embodiment (not shown), the pixel unit PX includes the light-emitting package 4, and the single light-emitting package 4 includes a plurality of light-emitting elements, and each light-emitting device constitutes one sub-pixel. In another embodiment (not shown), the sub-pixel includes the light-emitting element in accordance with any of the above-mentioned embodiments of the present application, and the first electrode 20 and the second electrode 30 of the light-emitting element are bonded to the bonding pads 8*a* and 8*b* on the substrate 200.

Figure 14:
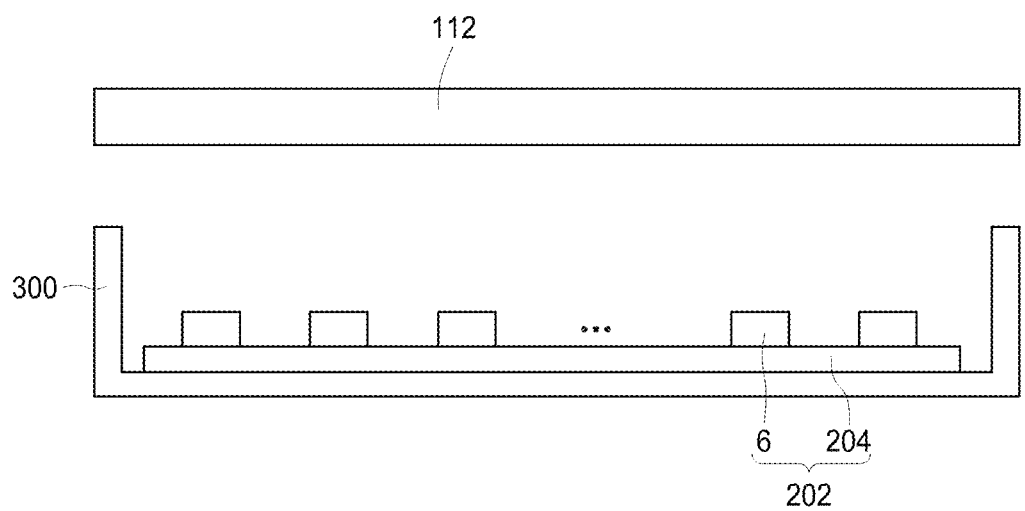
FIG. 14 shows a cross-sectional view of a backlight unit comprising the light-emitting element in accordance with the embodiments of the present disclosure.

FIG. 14 is a cross-sectional view of a backlight unit 103 comprising the light-emitting element in accordance with the embodiments of the present disclosure. The backlight unit 103 includes a chassis 300 accommodating a light source module 202, and an optical film 112 disposed on the light source module 202. The optical film 112 includes, for example, a light diffuser. In the present embodiment, the backlight unit 103 is a direct-lit backlight unit. The light source module 202 includes a circuit board 204 and a plurality of light sources 6 arranged on the upper surface of the circuit board 204. In one embodiment, the light source 6 includes the light-emitting element in accordance with any of the above-mentioned embodiments and is mounted on the upper surface of the circuit board 204 in a flip-chip manner.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting element, comprising:
   a base, comprising an upper surface, a lower surface and a plurality of side walls;
   a plurality of first modified regions formed on any one of the plurality of side walls, and wherein one of the plurality of first modified regions is extended between the lower surface and the upper surface;
   a semiconductor stack formed on the upper surface;
   an isolation region on the upper surface, not covered by the semiconductor stack and surrounding the semiconductor stack; and
   a dielectric stack covering the semiconductor stack and the isolation region,
   wherein the plurality of first modified regions is formed by a laser irradiating the base along the isolation region, and
   wherein the dielectric stack has a reflectance of 10%-50% and/or a transmittance of 50%-90% for the laser with a wavelength between 1000 nm to 1100 nm.

2. The light-emitting element according to claim 1, wherein:
   the plurality of side walls comprises a first side wall, a second side wall, a third side wall and a fourth side wall, the first side wall is opposite to the third side wall, and the second side wall is opposite to the fourth side wall;
   an included angle between the first side wall and the lower surface is θ1, and an included angle between the third side wall and the lower surface is θ3; and
   the difference between θ1 and θ3 is less than 5 degrees.

3. The light-emitting element according to claim 2, wherein:
   the plurality of first modified regions is located on the first side wall and the second side wall; and
   a gap between the adjacent first modified regions on the first sidewall is different from a gap between the adjacent first modified regions on the second sidewall, and/or a surface roughness of the first modified regions on the first sidewall is different from a surface roughness of the first modified regions on the second side wall.

4. The light-emitting element according to claim 1, wherein the semiconductor stack generates a light with a dominant wavelength, and wherein the dielectric stack has a reflectance of more than 90% for the dominant wavelength.

5. The light-emitting element according to claim 1, further comprising:
   an opening formed in the dielectric stack; and
   an electrode formed on the dielectric stack and electrically connected with the semiconductor stack through the opening.

6. The light-emitting element according to claim 1, wherein the base comprises a carrier and a bonding layer between the carrier and the semiconductor stack.

7. The light-emitting element according to claim 6, further comprising a plurality of second modified regions located on any one of the plurality of side walls;
   wherein the side wall of the base comprises a side wall of the carrier and a side wall of the bonding layer; and
   wherein the plurality of second modified regions is located on the side wall of the bonding layer.

8. The light-emitting element according to claim 7, wherein one of the plurality of second modified regions comprises a V-shape or a U-shape in a cross-sectional view.

9. The light-emitting element according to claim 1, wherein the thickness of the base is less than or equal to 100 μm and/or a size of the light-emitting element is less than or equal to 70,000 μm².

10. The light-emitting element according to claim 1, wherein the semiconductor stack comprises:
a first semiconductor layer on the upper surface;
an active region on the upper surface; and
a second semiconductor layer on the active layer.

11. The light-emitting element according to claim 10, further comprising a transparent conductive layer on the second semiconductor layer,
wherein the dielectric stack covers the transparent conductive layer.

12. The light-emitting element according to claim 11, wherein the dielectric stack comprises:
a first opening exposing the first semiconductor layer; and
a second opening exposing the second semiconductor layer, and
wherein the light-emitting element further comprises:
a first electrode on the dielectric stack and electrically connected to the first semiconductor layer through the first opening; and
a second electrode on the dielectric stack and electrically connected to the second semiconductor layer through the second opening.

13. The light-emitting element according to claim 12, further comprising a third electrode between the first electrode and the first semiconductor layer, or a fourth electrode between the second electrode and the second semiconductor layer.

14. The light-emitting element according to claim 1, wherein the dielectric stack comprises a first group of dielectric layers composed of a first sub-layer a and a second sub-layer alternately stacked, and the first sub-layer and the second sub-layer constitute a pair of dielectric pair.

15. The light-emitting element according to claim 14, wherein first sub-layer comprises a refractive index higher than that of the second sub-layer, and/or the first sub-layer has a smaller thickness than the second sub-layer.

16. The light-emitting element according to claim 14, wherein the dielectric stack further comprises a second group of dielectric layers composed of a third sub-layer and a fourth sub-layer alternately stacked, and the third sub-layer and the fourth sub-layer constitute a pair of dielectric pair, wherein the third sub-layer and the first sub-layer comprise different thicknesses, and the third sub-layer and the first sub-layer comprises the same material or different materials.

17. The light-emitting element according to claim 16, wherein the third sub-layer comprises a higher refractive index than that of the fourth sub-layer, and/or the third sub-layer comprises a smaller thickness than that of the fourth sub-layer.

18. A display device, comprising:
a substrate, comprising a display area and a non-display area;
a plurality of pixel units, arranged in the display area and comprising a plurality of sub-pixels; and
a data driver and a scanning driver, provided in the non-display area;
wherein each of the plurality of sub-pixels comprises the light-emitting element of claim 1.

19. A backlight unit, comprising:
a light source module, comprising a circuit board, and a plurality of light sources arranged on the circuit board;
an optical film, disposed on the light source module;
wherein each of the plurality of light sources comprises the light-emitting element of claim 1.

* * * * *